(12) United States Patent
Bernstein et al.

(10) Patent No.: US 7,898,285 B2
(45) Date of Patent: Mar. 1, 2011

(54) OPTIMAL LOCAL SUPPLY VOLTAGE DETERMINATION CIRCUIT

(75) Inventors: Kerry Bernstein, Underhill, VT (US); David S. Wolpert, Rochester, NY (US)

(73) Assignee: International Business Machines Corporation, Armonk, NY (US)

( * ) Notice: Subject to any disclaimer, the term of this patent is extended or adjusted under 35 U.S.C. 154(b) by 497 days.

(21) Appl. No.: 12/055,569

(22) Filed: Mar. 26, 2008

(65) Prior Publication Data

US 2009/0243648 A1 Oct. 1, 2009

(51) Int. Cl.
*H03K 19/00* (2006.01)
(52) U.S. Cl. .............................. 326/16; 326/80; 327/544
(58) Field of Classification Search .................. 326/16, 326/80; 716/4; 327/534–544
See application file for complete search history.

(56) References Cited

U.S. PATENT DOCUMENTS

| | | | |
|---|---|---|---|
| 5,051,882 A | 9/1991 | Grimm et al. | |
| 6,700,435 B2 | 3/2004 | Becker | |
| 6,876,252 B2 | 4/2005 | Kim et al. | |
| 6,927,619 B1 | 8/2005 | Doyle | |
| 7,051,306 B2* | 5/2006 | Hoberman et al. | 716/4 |
| 7,219,244 B2 | 5/2007 | Kuang et al. | |
| 7,221,193 B1* | 5/2007 | Wang et al. | 326/30 |
| 7,262,631 B2 | 8/2007 | Chong | |
| 2009/0085651 A1* | 4/2009 | Liu et al. | 327/539 |
| 2009/0167093 A1* | 7/2009 | Nguyen et al. | 307/80 |

\* cited by examiner

*Primary Examiner*—Jessica Han
(74) *Attorney, Agent, or Firm*—Scully, Scott, Murphy & Presser, P.C.; Michael J. LeStrange, Esq.

(57) ABSTRACT

A test circuit that compares test results between two tests with different local supply voltages is provided. The output of each stage of the logic circuits is stored in a first register of each test circuit. Each test is performed with a critical test vector and a local supply voltage that decreases from test to test. The outputs of successive tests are compared in each test circuit. The tests are performed iteratively with successive reduction in the value of the local supply voltage until at least one stage of the logic circuits produces non-matching results between the first and second register. The voltage immediately before producing such non-matching results is the minimum operational voltage for the local voltage island.

20 Claims, 5 Drawing Sheets

OPTIMAL LOCAL SUPPLY VOLTAGE DETERMINATION CIRCUIT

FIELD OF THE INVENTION

The present invention relates to a semiconductor circuit for determining an optimal local supply voltage for a voltage island in a semiconductor chip, and methods of operating the same.

BACKGROUND OF THE INVENTION

Many high performance semiconductor chips and low power semiconductor chips employ local voltage islands that employ a reduced power supply voltage compared to the rest of a semiconductor chip. FIG. 1 shows a prior art semiconductor chip 100 that employs a regular supply voltage region 11, a first local voltage island 12A, and a second local voltage island 12B. Within each of the local voltage islands (12A, 12B), a local power supply voltage, which is lower than the power supply voltage employed in the regular supply voltage region 11, is provided to the semiconductor circuitry therein. As an illustrative example, circuits in the regular supply voltage region 11 may employ 1.5 V, circuits in the first local voltage island may employ 1.2 V, and circuits in the second local voltage island may employ 1.1 V for operation.

Local voltage islands enable energy efficient operation of a semiconductor chip, which becomes critical, for example, in low power semiconductor chips employed in mobile devices operating on a battery. Further, reduction of heat generation from the local voltage islands may enable faster operation of the rest of the semiconductor chip since the operation of the overall semiconductor chip is limited by the total amount of heat generation. For example, the regular supply voltage region 11 of FIG. 1 may be allowed to operate faster and generate more heat if the heat generation from the local voltage islands (12A, 12B) may be reduced.

The local voltage islands (12A, 12B) are designed for a reduced voltage operation. The magnitude of the reduced voltage is determined by the circuit design, and the physical semiconductor chip provides such reduced voltages over a single distribution network or multiple distribution networks to conserve power during operation of the semiconductor chip in a low power mode.

Due to process variations inherent in the manufacture of semiconductor chips, each semiconductor chip may have different minimum operating voltage even for the same local voltage island. Further, the design point for the local supply voltage within a given local voltage island may turn out to be too optimistic, in which case the full power-savings potential of the local supply voltage within a given local voltage island may turn out to be too pessimistic, in which case the circuit within the local voltage island is not fully functional at a nominal operation voltage, i.e., the semiconductor chip may operate only above the nominal operation voltage at which the local voltage island is provided with a higher voltage than the voltage at the design point.

Yet further, process variations inherent in semiconductor manufacturing steps may introduce performance variations between individual semiconductor chips such that an operational voltage range varies from chip to chip. Such operational voltage range may also vary locally within a semiconductor chip from one voltage island to another voltage island.

In view of the above, there exists a need for a circuit for modulating a local supply voltage to a local voltage island as necessary for functional operation of a logic circuit within the local voltage island.

Further, there exists a need for a circuit for determining the minimum local supply voltage that is required to maintain full functionality of the logic circuit within the local voltage island and methods of operating the same.

BRIEF SUMMARY OF THE INVENTION

To address the needs described above, the present invention provides a semiconductor circuit for testing functionality of a logic circuit within a local voltage island at various local supply voltages and determining the minimal local supply voltage for the local voltage island to be functional.

In the present invention, a register in a signal path between each stage of logic circuits located in a local voltage island is replaced with a test circuit containing at least two registers and a multiplexer. The logic circuits are tested under the condition of a critical test vector, which is provided as an input to each stage of the logic circuits, and a value of the local supply voltage that is known to render all the logic circuits functional. The output of each stage of the logic circuits is stored in a first register of each test circuit. The logic circuits are tested again under the condition of the critical test vector and a reduced value of the local supply voltage. At the end of the test, the data on the first register is shifted to a second register within each test circuit. The output of each stage of the logic circuits is stored in the first register of each test circuit, and is compared with the data in the second register in the same test circuit. If the data in the first and second register in each test circuit match, the logic circuit that provided test results to the test circuit is functional at the reduced value of the local supply voltage. The tests are performed iteratively with successive reduction in the value of the local supply voltage until at least one stage of the logic circuits produces non-matching results between the first and second register. The voltage immediately before producing such non-matching results is the minimum operational voltage for the local voltage island.

According to an aspect of the present invention, a semiconductor circuit is provided, which comprises:

a logic circuit providing a logic output;

a first register receiving the logic output and generating a first register output;

a second register receiving the first register output and generating a second register output;

a comparator that compares the first register output and the second register output and generating a comparator output; and a multiplexer receiving the first register output, at least one test vector bit, and a test signal and generating a multiplexer output; wherein a supply voltage of the logic circuit is controlled by the comparator output as a circuit operation parameter which modulates a local supply voltage within the logic circuit.

In one embodiment, the multiplexer output is selected based on the test signal between the first register output and the at least one test vector bit.

In another embodiment, the at least one test vector bit includes at least one of a critical delay path test vector bit and a critical voltage droop test vector bit, wherein the critical delay path test vector bit is a data bit that induces maximum signal delay time within the logic circuit, and wherein the critical voltage droop test vector bit is a data bit that induces maximum droop in a local supply voltage in the logic circuit.

In even another embodiment, the at least one test vector bit is hard coded into the multiplexer by wiring to a global supply voltage or to ground.

In yet another embodiment, the at least one test vector bit is generated by an external test circuit in a semiconductor chip or supplied by a tester external to a semiconductor chip.

In still another embodiment, the logic output is transferred through the first register to become the first register output in a test cycle.

In still yet another embodiment, the logic circuit is configured to reduce the local supply voltage if and only if the first register output and the second register output are the same.

In a further embodiment, the semiconductor circuit further comprises a test stop monitor circuit receiving the comparator output and generating a test stop signal if and only if the first register output and the second register output are different, wherein routing of the test stop signal is configured to induce stopping of testing on the logic circuit.

In an even further embodiment, the logic circuit is configured to increment the local supply voltage if and only if the first register output and the second register output are different.

In a yet further embodiment, the logic circuit includes a local supply voltage generator, wherein the local supply voltage generator generates the local supply voltage from a global supply voltage having a magnitude greater than or equal to the local supply voltage.

In a still further embodiment, the local supply voltage generator comprises a voltage divider and a second multiplexer, wherein an output of the second multiplexer is selected from multiple reference voltage inputs to the second multiplexer based on the comparator output.

In a further embodiment, the local supply voltage generator controls and provides the supply voltage to multiple logic circuits, wherein the supply voltage is generated from an output of a local supply voltage generator circuit.

According to another aspect of the present invention, a semiconductor circuit is provided, which comprises:

a first register generating a first register output;

a second register receiving the first register output and generating a second register output;

a first comparator that compares the first register output and the second register output and generating a first comparator output signal;

a first multiplexer receiving the first register output, at least one first test vector bit, and a test signal and generating a first multiplexer output;

a logic circuit receiving the first multiplexer output as a logic input and generating a logic output;

a third register receiving the logic output and generating a third register output;

a fourth register receiving the third register output and generating a fourth register output;

a second comparator that compares the third register output and the fourth register output and generating a second comparator output; and a second multiplexer receiving the third register output, at least another test vector bit, and the test signal and generating a second multiplexer output, wherein the each of the at least one test vector bit is derived from a same test vector as one of the at least another test vector bit.

In one embodiment, the same test vector is one of a critical delay path test vector and a critical voltage droop test vector, wherein the critical delay path test vector is a data set that induces maximum signal delay time within the logic circuit, and wherein the critical voltage droop test vector is a data set that induces maximum droop in a local supply voltage in the logic circuit.

According to yet another aspect of the present invention, a method of determining a minimum operational voltage for a local voltage island in a semiconductor chip is provided. The method comprises:

providing a circuit comprising:
    a multiplexer receiving at least one test vector bit and generating a multiplexer output and having a test input node to which a test input signal is applied;
    a logic circuit receiving the multiplexer output as a logic input and generating a logic output;
    a first register receiving the logic output and generating a first register output;
    a second register receiving the first register output and generating a second register output;
    a comparator that compares the first register output and the second register output and generating a comparator output: and
    a local supply voltage generator circuit employing the comparator output to modulate a local supply voltage of the logic circuit;

applying a test input signal to the test input node, wherein the multiplexer output is selected from the at least one test vector bit based on the test input signal; and adjusting the local supply voltage based on the local supply voltage generation circuit based on the comparator output.

In one embodiment, the method further comprises reducing the local supply voltage if and only if the first register output and the second register output are the same.

In another embodiment, the method further comprises generating a test stop signal if and only if the first register output and the second register output are different.

In even another embodiment, the method further comprises increasing the local supply voltage if and only if the first register output and the second register output are different.

In yet another embodiment, the logic output is transferred through the first register to become the first register output in a test cycle.

In still another embodiment, the logic circuit includes a local supply voltage generator, and the local supply voltage generator generates the local supply voltage from a global supply voltage having a magnitude greater than or equal to the local supply voltage.

In still yet another embodiment, the local supply voltage generator comprises a voltage divider and a second multiplexer, an output of the second multiplexer is selected from multiple reference voltage inputs to the second multiplexer based on the comparator output, the local supply voltage is decremented by one setting if the first register output and the second register output are the same, and the local supply voltage is incremented by one setting if the first register output and the second register output are different.

DETAILED DESCRIPTION OF THE INVENTION

Figure 1:
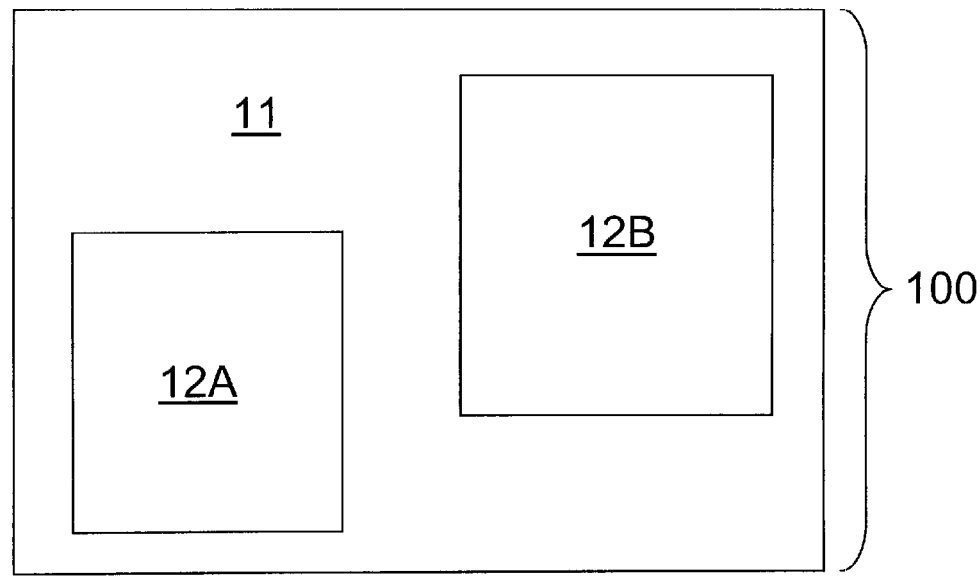
FIG. 1 is a prior art semiconductor chip including local voltage islands.

As stated above, the present invention relates to a semiconductor circuit for determining an optimal local supply voltage for a voltage island in a semiconductor chip, and methods of operating the same, which are now described in detail with accompanying figures. It is noted that like and corresponding elements are referred to by like names or reference numerals in the figures.

Figure 2:
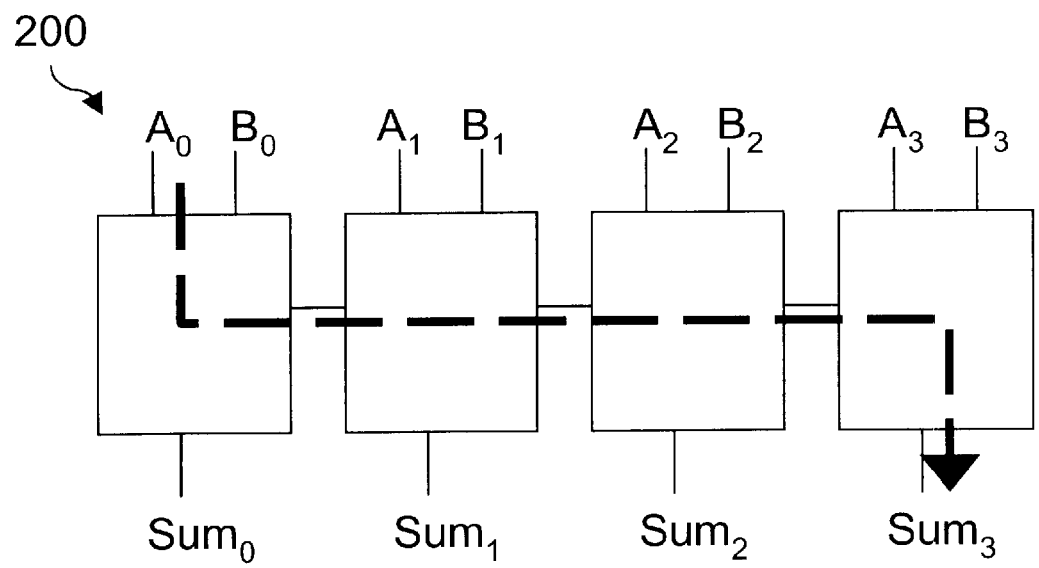
FIG. 2 is an exemplary 4-bit adder 200 for illustration of a critical delay path, a critical delay path test vector.

Referring to FIG. 2, an exemplary 4-bit adder 200 comprises four logic units, each of which is provided with two input nodes and an output node. The concepts of a critical delay path, a critical delay path test vector, and a critical voltage droop test vector, which are developed in the present invention and applicable to general semiconductor logic circuits, are illustrated with the exemplary 4-bit adder 200.

A carryover node between adjacent logic units provides a signal path for relaying a carryover bit from one logic unit to another. The exemplary 4-bit adder 200 is capable of adding a first number A and a second number B. The first number A has numeric value of $A_3A_2A_1A_0$ in the binary number system, $A_0$ being the lowest bit and $A_3$ being the highest bit. Each value of $A_0$, $A_1$, $A_2$, and $A_3$ is either 1 or 0. Similarly, the second number B has numeric value of $B_3B_2B_1B_0$ in the binary number system, $B_0$ being the lowest bit and $B_3$ being the highest bit. Each value of $B_0$, $B_1$, $B_2$, and $B_3$ is either 1 or 0. Each of the eight input nodes are supplied with a signal representing $A_0$, $A_1$, $A_2$, $A_3$, $B_1$, $B_1$, $B_2$, or $B_3$, respectively. Each of the logic units generates an output value, which is labeled $Sum_0$, $Sum_1$, $Sum_2$, or $Sum_3$. The exemplary 4-bit adder 200 adds the first number A and the second number B in binary addition and provides a number, which is the binary sum of the first number A and the second number B, as represented by the values of the four output values, $Sum_0$, $Sum_1$, $Sum_2$, or $Sum_3$.

Depending on the value of a test vector, i.e., the set of values for $A_0$, $A_1$, $A_2$, $A_3$, $B_0$, $B_1$, $B_2$, and $B_3$, the output of the exemplary 4-bit adder 200 has different circuit delay time, i.e., the time period between the time the test vector is applied to the eight input nodes and the time correct output is provided by the four output nodes. In this particular case, the circuit delay time is maximum for the case in which the first number A has a binary value of 0001 and the second number B has a binary value of 0111 or vice versa. The test vector of <0, 0, 0, 1, 0, 1, 1, 1>, in which each component represents values for $A_3$, $A_2$, $A_1$, $A_0$, $B_3$, $B_2$, $B_1$, and $B_0$ sequentially, is a critical delay path test vector, which induces the maximum circuit delay possible during the operation of the exemplary 4-bit adder 200.

All other values of the test vector would provide an output within a delay time that is less than or equal to the delay time between application of the test vector and generation of a valid output, which is the binary sum of the first number A and the second number B provided within the test vector, as represented by the values of the four output values, $Sum_0$, $Sum_1$, $Sum_2$, or $Sum_3$. Thus, confirmation of the operation of the exemplary 4-bit adder 200 within a given clock cycle for the critical delay path test vector provides a very high likelihood that the exemplary 4-bit adder 200 would operate within the number of clock cycles for all test vector conditions. The path for the component of the signal that determines the maximum circuit delay is a critical test path, which is indicated by a broken arrow in FIG. 2. Typically, the critical test path corresponds to a signal path through the largest number of gates or logic units within the operation of a given circuit.

During operation of the exemplary 4-bit adder 200, local voltage droop within any of the four logic units may render the exemplary 4-bit adder 200 non-functional. The degree of such voltage droop may depend on the value of the test vector provided to the input nodes as well as the physical implementation of the logic gates, which may be selected from a NAND gate, a NOR gate, XOR gate, an AND gate, a OR gate, any other logic gate, or a combination thereof. By analyzing the design for the exemplary 4-bit adder 200 at logic gates level, input values inducing the maximum power consumption, and thus, the maximum voltage droop may be determined. By combining such input values, a critical voltage droop test vector may be constructed.

Since the exemplary 4-bit adder 200 consumes the most power when the critical voltage droop test vector is applied to the input nodes, the local voltage droop within each of the four logic units is the greatest for the critical voltage droop test vector. For example, the test vector of <1, 1, 1, 1, 0, 0, 0, 0>, in which each component represents values for $A_0$, $A_1$, $A_2$, $A_3$, $B_0$, $B_1$, $B_2$, and $B_3$ sequentially, may be a critical voltage droop test vector, which induces the maximum local voltage droops possible during the operation of the exemplary 4-bit adder 200. While the exact value of the critical voltage droop test vector may vary from physical implementation to physical implementation as discussed above, each physical implementation has a critical voltage droop test vector that may be employed to induce the maximum local voltage droop within the exemplary 4-bit adder 200.

All other values of the test vector would provide an output with a local voltage droop that is less than or equal to the local voltage droop caused by the application of the critical voltage droop test vector. Thus, confirmation of the operation of the exemplary 4-bit adder 200 within a given clock cycle for the critical voltage droop test vector provides a very high likelihood that the exemplary 4-bit adder 200 would operate at the applied power supply voltage for all test vector conditions. In other words, confirmation of the operation of the exemplary 4-bit adder 200 for the critical voltage droop test vector at the applied power supply voltage provides a highly reliable test result indicating that the exemplary 4-bit adder 200 would be functional for all test vector conditions at the applied power supply voltage.

In general, both of the critical delay path test vector and the critical voltage droop test vectors may be employed to determine the optimal supply voltage for a variety of semiconductor circuits. Each of the critical delay path test vector and the critical voltage droop test vector tests the circuit, or the system, under different conditions. On one hand, employing the critical delay path test vector to test the critical delay path provides a good indication of the worst-case process variations which would affect any input, but the critical delay path test vector does not necessarily cause the maximum supply voltage droop, which is also an important factor in determining the maximum delay of a path. Changes in performance due to temperature variations may be accounted for by repeating the test when any substantial changes in temperature may be present for any reason. On the other hand, employing the critical voltage droop test vector to test the worst case voltage droop provides a good indication of the soundness of a power supply grid, but the critical voltage droop test vector does not test the circuit for the critical delay path, which may produce more signal delay time than the test results under the critical voltage droop test vector may indicate. By employing both the critical delay path test vector and the critical voltage droop test vector, a more reliable estimation of circuit performance under worst case input combinations may be obtained.

Figure 3:
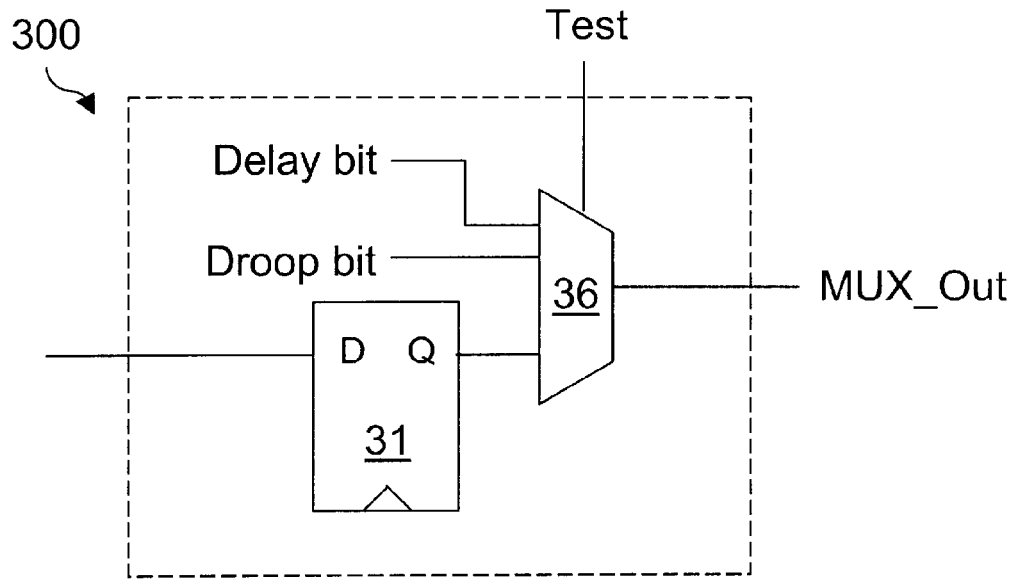
FIG. 3 is a first exemplary test circuit 300 according to the present invention.

Referring to FIG. 3, a first exemplary test circuit 300 according to the present invention comprises a register 31 and a multiplexer 36. Two input vector bits, i.e., a critical delay path test vector bit and a critical voltage droop test vector bit, are provided to the multiplexer 36. The critical delay path test vector bit is a binary component of a critical delay path test vector for a logic circuit. The critical voltage droop test vector bit is a binary component of a critical voltage droop test vector for a logic circuit. The critical delay path test vector bit and the critical voltage droop test vector bit are labeled "Delay bit" and "Droop bit," respectively. In one embodiment, the critical delay path test vector bit and the critical voltage droop test vector bit are hard-coded into the first exemplary test circuit 300 by connecting to a power supply or to electrical ground. In case any of the critical delay path test vector bit and the critical voltage droop test vector bit is connected to the power supply, the power supply may be a local voltage supply, which may vary within a local voltage island, or a global voltage supply, which is constant throughout the semiconductor chip. Alternatively, the droop bit and/or the delay bit may be generated by an external test circuit in a semiconductor chip or supplied by a tester external to a semiconductor chip.

The multiplexer 36 is provided with a test input node, to which a test input signal is applied to determine the output "MUX_Out" of the multiplexer 36. Specifically, depending on the test input signal applied to the test input node, the multiplexer 36 selects one of the signal inputs, i.e., the critical delay path test vector bit, the critical voltage droop test vector bit, and the output of the register 31, and transmits the selected signal input to the multiplexer output "MUX_Out."

According to the present invention, an instance of the first exemplary test circuit 300 replaces a register at each input node of a logic circuit that is configured to receive a test input bit. For example, the exemplary 4-bit adder 200 comprises eight input registers (not shown) configured to receive the eight test bits of a test vector. Each of the eight registers in the exemplary 4-bit adder 200 may be replaced with an instance of the first exemplary test circuit 300 so that a test input vector selected from the critical delay path test vector and the critical voltage droop test vector may be applied to the exemplary 4-bit adder 200 when the test signal node applies a test signal to the exemplary 4-bit adder 200. Thus, the output of the exemplary 4-bit adder 200 is overridden during operation in a test mode. The output of the exemplary 4-bit adder 200 is determined by the type of test, i.e., a test with critical delay path test vector or a test with the critical voltage droop test vector, selected though the test signal applied to the test signal node.

During a normal mode of operation, the first exemplary test circuit 300 selects the output of the register 31 as the multiplexer output "MUX_Out" so that the exemplary 4-bit adder 200 may function as a normal logic circuit.

While the present invention is described with the exemplary 4-bit adder 200 for illustrative purposes, the present invention may be applied to any logic circuit employing a register at an input node. Thus, the first exemplary test circuit 300 replaces a single register of the prior art to enable testing of any logic circuit with a critical delay path test vector and a critical voltage droop test vector.

Multiple logic circuits may be connected in a semiconductor chip in which signal propagates from a first logic circuit to a second logic circuit through a set of register inputs provided within the second logic circuit. The present invention also provides a test circuit that may be employed instead of the input registers within such a second logic circuit.

Figure 4:
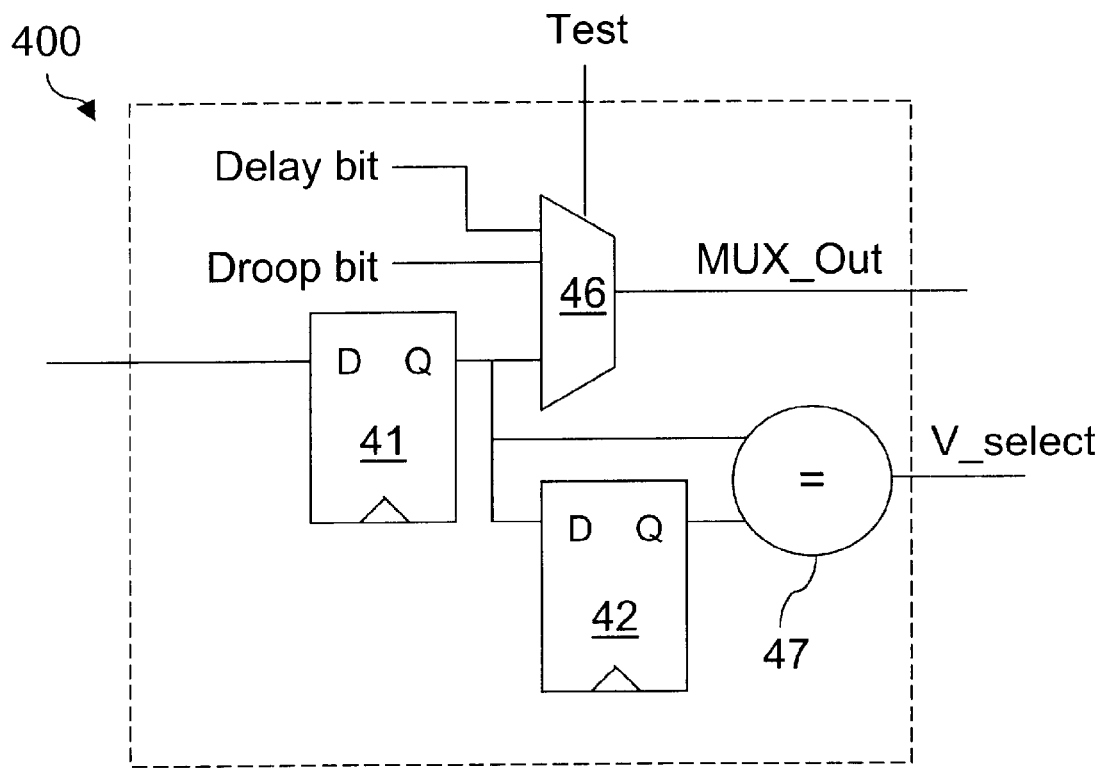
FIG. 4 is a second exemplary test circuit 400 according to the present invention.

Referring to FIG. 4, a second exemplary test circuit according to the present invention comprises a first register 41, a second register 42, a multiplexer 46, and a comparator 47. A critical delay path test vector bit and a critical voltage droop test vector bit are provided to the multiplexer 46 in the same manner as in the first exemplary test circuit containing the multiplexer 36. In one embodiment, the critical delay path test vector bit and the critical voltage droop test vector bit are hard-coded into the second exemplary test circuit 400 by connecting to a power supply or to electrical ground. In case any of the critical delay path test vector bit and the critical voltage droop test vector bit is connected to the power supply, the power supply may be a local voltage supply, which may vary within a local voltage island, or a global voltage supply, which is constant throughout the semiconductor chip. Alternatively, the droop bit and/or the delay bit may be generated by an external test circuit in a semiconductor chip or supplied by a tester external to a semiconductor chip.

The multiplexer 46 is provided with a test input node, to which a test input signal is applied to determine the output "MUX_Out" of the multiplexer 46. Specifically, depending on the test input signal applied to the test input node, the multiplexer 46 selects one of the signal inputs, i.e., the critical delay path test vector bit, the critical voltage droop test vector bit, and the output of the first register 41, i.e., a first register output, and transmits the selected signal input to the multiplexer output "MUX_Out."

The first register 41 receives a logic output from a previous stage logic circuit (not shown) and transfers the logic output through the first register 41 to become the first register output in a test cycle. The second register 42 receives the first register out as an input and generates a second register output. The first register output is transferred through the second register 42 to become the second register output after a test under a given test vector is completed. Therefore, there is a delay of one test cycle, which may include multiple clock cycles for the logic circuitry, between the first register output and the second register output.

Both the first register output and the second register output are applied to a comparator 47 to compare the logic values of the first register output and the second register output. An output signal of the comparator, or a "comparator output," labeled "V_select" is generated based on whether the logic values of the first register output and the second register output are the same or different.

According to the present invention, an instance of the second exemplary test circuit 400 replaces a register at each input node of a second stage logic circuit (not shown) that is configured to receive a logic output of a first stage logic circuit (not shown). During a test mode of operation, a local supply voltage of the first stage logic circuit may be lowered in successive test cycles which start with a cycle that is known to render the first stage logic circuit operational, e.g., a nominal circuit operation voltage. A correct test output is generated and transferred into the first register 41 until a value of the local supply voltage of the first stage logic circuit is reached at which the logic output of the first stage logic circuit changes, i.e., when the local supply voltage is lowered enough to render the first stage logic circuit non-functional.

During such testing, the first register output and the second register output are the same as long as the first stage logic circuit is functional. Thus, the comparator 47 generates an output signal that indicates that the first register output and the second register output are the same. The comparator output changes, however, as soon as the first stage logic circuit fails for the first time, i.e., when the local supply voltage reaches a value at which the first stage logic circuit becomes non-functional. The change in the comparator output may be employed to indicate the end of testing, and to increase the setting of the local supply voltage for the first stage logic circuit to a known minimum voltage that renders the first stage logic circuit operational. The testing may be performed with a critical delay path test vector and a critical voltage droop test vector.

During a normal mode of operation, the second exemplary test circuit 400 selects the output of the first register 41 as the multiplexer output "MUX_Out."

Figure 5:
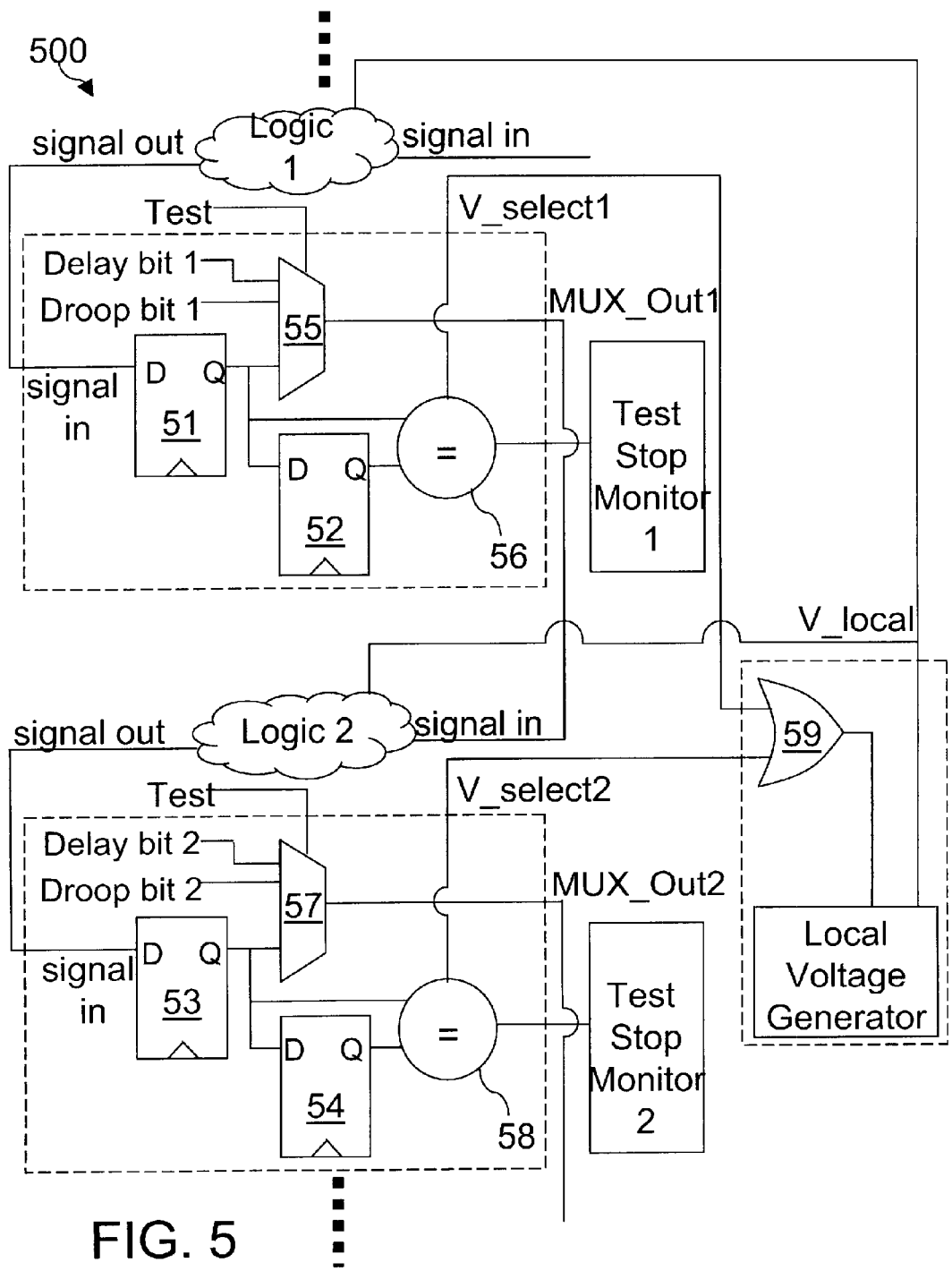
FIG. 5 is an exemplary semiconductor circuit 500 according to the present invention.

FIG. 5 is an exemplary semiconductor circuit according to the present invention that illustrates general application of the second exemplary test circuit for multi-stage logic circuits. The exemplary semiconductor circuit comprises a first logic circuit (labeled "Logic 1"), a first stage test circuit, a second logic circuit (labeled "Logic 2"), a second stage test circuit, an optional first stage test stop monitor circuit (labeled "Test Stop Monitor 1"), an optional second stage test stop monitor circuit (labeled "Test Stop Monitor 2"), and a local voltage generation circuit. The exemplary semiconductor circuit may contain additional stage logic circuits and accompanying test circuits before the first stage logic circuit and after the second stage logic circuit to encompass a set of logic circuits that are tested for determining a local minimum supply voltage.

The first stage test circuit comprises a first register 51, a fourth register 54, a first multiplexer 55, and a first comparator 56. The first logic circuit provides a first logic output, which is received by the first register 51 and transferred through the first register 51 in one test cycle, i.e., the first register 51 generates a first register output which has the same value as the first logic output prior to one test cycle. The second register 52 receives the first register output as an input, and generates a second register output, which is the same as the value of the first register output prior to one test cycle. The first register output and the second register output are supplied to the first comparator 56 and are compared. The first comparator 56 generates a first comparator output that changes depending on whether the first register output and the second register output are the same or not.

The first multiplexer 55 operates in the same manner as the multiplexer 36 of the first exemplary test circuit and the multiplexer 46 of the second exemplary test circuit. The first multiplexer 55 generates a first multiplexer output (labeled "MUX_Out1"), which is provided to the second logic circuit as an input signal.

The first comparator output is supplied to the local voltage generation circuit as a first voltage select signal (labeled "V_select1"). The first comparator output may also be supplied to a first stage test stop monitor circuit that may control any further execution of testing on the first logic circuit. In other words, the first stage test stop monitor circuit may receive the first comparator output and generate a test stop signal, which stops testing on the first stage logic circuit. Such a test stop signal may be employed to determine a minimum local power supply voltage in a test scheme in which the local power supply voltage is continually decreased as described above for the second exemplary test circuit. Preferably, the test stop signal is generated if and only if the first register output and the second register output are different. The routing of the test stop signal may be configured to induce stopping of testing on the first logic circuit only, or to induce stopping of testing of other logic circuits including the second logic circuit as well as the first logic circuit.

The second stage test circuit comprises a third register 53, a fourth register 54, a second multiplexer 57, and a second comparator 58. The first multiplexer output from the first multiplexer 55, which is the logical output of the previous stage logic circuit, is received by the third register 53 and transferred through the third register 53 in one test cycle, i.e., the third register 53 generates a third register output which has the same value as the first multiplexer output prior to one test cycle. The fourth register 54 receives the third register output as an input, and generates a fourth register output, which is the same as the value of the third register output prior to one test cycle. The third register output and the fourth register output are supplied to the second comparator 58 and are compared. The second comparator 58 generates a second comparator output that changes depending on whether the third register output and the fourth register output are the same or not.

The second comparator output is supplied to the local voltage generation circuit as a second voltage select signal (labeled "V_select2"). The second comparator output may also be supplied to a second stage test stop monitor circuit that may control any further execution of testing on the second logic circuit. In other words, the second stage test stop monitor circuit may receive the second comparator output and generate a test stop signal, which stops testing on the second stage logic circuit. Such a test stop signal may be employed to determine a minimum local power supply voltage in a test scheme in which the local power supply voltage is continually decreased as described above for the second exemplary test circuit. Preferably, the test stop signal is generated if and only if the third register output and the fourth register output are different. The routing of the test stop signal may be configured to induce stopping of testing on the second logic circuit only, or to induce stopping of testing of other logic circuits including the first logic circuit as well as the second logic circuit.

As in the test scheme employed in the second exemplary test circuit, the first voltage select signal and the second voltage select signal are routed to the local voltage generation circuit as an input to OR gate 59. OR gate 59 may have a number of inputs dependent on the number of logic circuits controlled by the local voltage generation circuit. The output of OR gate 59 is input to the Local Voltage Generator, to be described later, which outputs the local supply voltage signal (labeled "V_local") to circuits Logic 1 and Logic 2. For example, the controlled logic circuits may be configured to reduce the local supply voltage if and only if the first register output and the second register output are the same, or if and only if the third register output and fourth register output are the same. Once the minimum local supply voltage is determined for the group of locally supplied logic circuits, the setting for the local supply voltage may be adjusted to restore the last good local supply voltage that renders the first and second logic circuit functional. This may be effected by configuring the local voltage generation circuit to increment the local supply voltage by one setting if and only if the first register output and the second register output are different, which corresponds to the first voltage at which the first logic circuit fails as the local supply voltage to the first logic circuit is continually decreased in each successive testing cycle. Similarly, the local voltage generation circuit may also be configured to increment the local supply voltage by one setting if and only if the third register output and the fourth register output are different.

Figure 6:
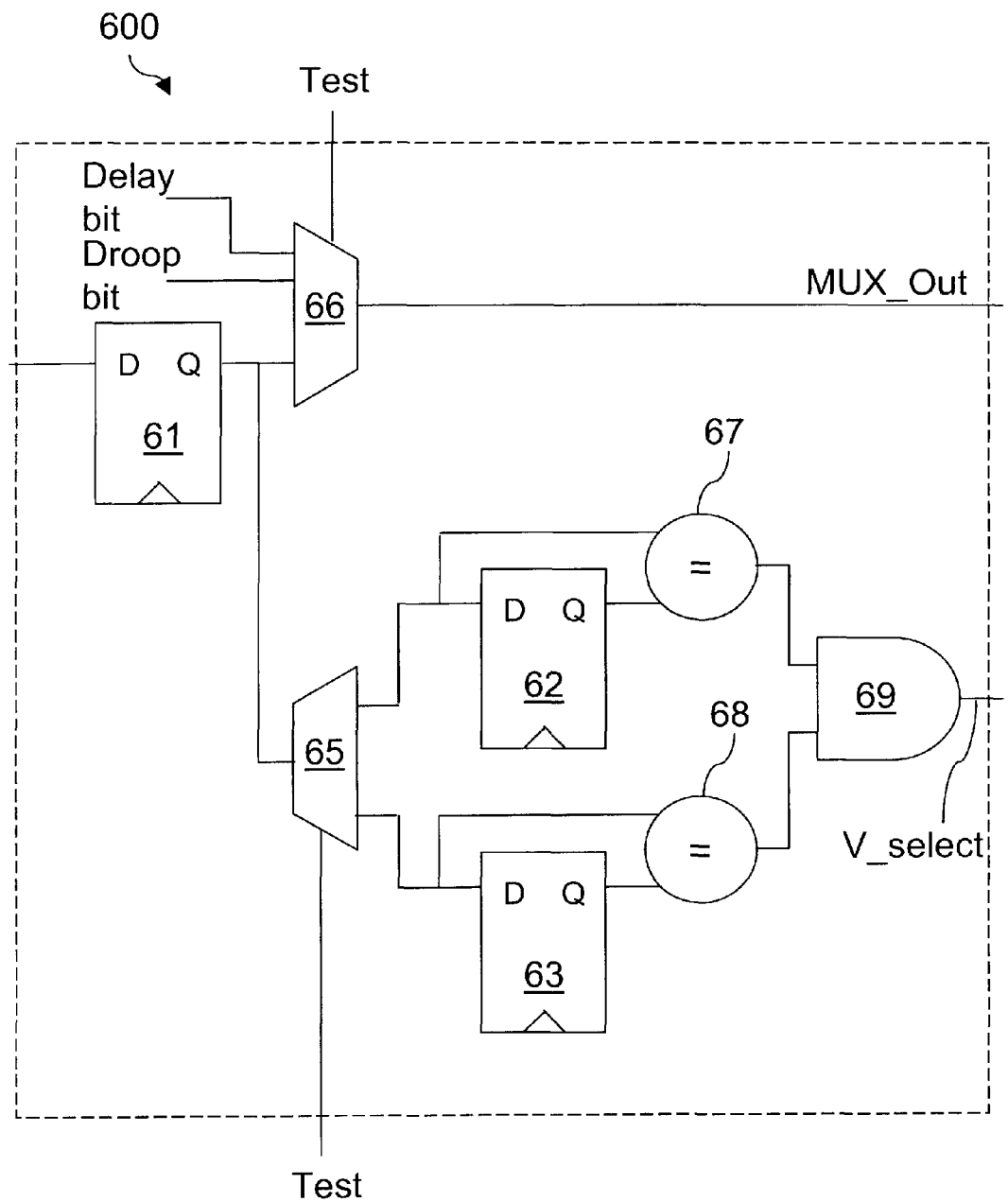
FIG. 6 is a third exemplary test circuit 600 according to the present invention.

Referring to FIG. 6, a third exemplary test circuit according to the present invention comprises a first register 61, a second register 62, a third register 63, a multiplexer 66, a demultiplexer 65, a first comparator 67, a second comparator 68, and an AND gate 69. A critical delay path test vector bit and a critical voltage droop test vector bit are provided to the multiplexer 66 in the same manner as in the first exemplary test circuit containing the multiplexer 36. In one embodiment, the critical delay path test vector bit and the critical voltage droop test vector bit are hard-coded into the third exemplary test circuit 600 by connecting to a power supply or to electrical ground. In case any of the critical delay path test vector bit and the critical voltage droop test vector bit is connected to the power supply, the power supply may be a local voltage supply, which may vary within a local voltage island, or a global voltage supply, which is constant throughout the semiconductor chip. Alternatively, the droop bit and/or the delay bit may be generated by an external test circuit in a semiconductor chip or supplied by a tester external to a semiconductor chip.

The multiplexer 66 is provided with a test input node, to which a test input signal is applied to determine the output "MUX_Out" of the multiplexer 66. Specifically, depending on the test input signal applied to the test input node, the multiplexer 66 selects one of the signal inputs, i.e., the critical delay path test vector bit, the critical voltage droop test vector bit, and the output of the first register 61, i.e., a first register output, and transmits the selected signal input to the multiplexer output "MUX_Out."

The first register 61 receives a logic output from a previous stage logic circuit (not shown) and transfers the logic output through the first register 61 to become the first register output in a test cycle. A pair of tests at a given setting of a local supply voltage is performed on the previous stage logic circuit employing a critical delay path test vector for the first testing and a critical voltage droop test vector for the second testing. Additional pairs of testing are performed in which the local supply voltage is decremented in each successive pair of testing.

The demultiplexer 65 receives the first register out as an input and generates an output for either the second register 62 or the third register 63. Specifically, depending on whether the first register output, which is the input for the demultiplexer 65, is based on a testing employing the critical delay path test vector or the critical voltage droop test vector in the previous stage logic circuit that provides the input to the first register 61, the output of the demultiplexer 65 is applied either to the second register 62 or to the third register. For example, if the first register output is based on a testing employing the critical delay path test vector, the output of the demultiplexer 65 is applied to the second register 62 through a first output node of the demultiplexer 65. Likewise, if the first register output is based on a testing employing the critical voltage droop test vector, the output of the demultiplexer 65 is applied to the third register 63 through the second output node of the demultiplexer 65. The demultiplexer 65 and the multiplexer 66 may be controlled by the same test signal.

The input signal to the second register 62 is transferred to become a second register output in two test cycles, which include a test cycle employing the critical delay path test vector and another test cycle employing the critical voltage droop test vector. Similarly, the input signal to the third register 63 is transferred to become a third register output in two test cycles, which include a test cycle employing the critical delay path test vector and another test cycle employing the critical voltage droop test vector.

The first comparator 67 compares the output of the demultiplexer 65 for a test employing the critical delay path test vector and a current setting of the local supply voltage for the previous stage logic circuit and the second register output from the second register 62, which is the same as the output of the demultiplexer 65 for a test employing the critical delay path test vector and a previous setting of the local supply voltage for the previous stage logic circuit. Likewise, the second comparator 68 compares the output of the demultiplexer 65 for a test employing the critical voltage droop test vector and a current setting of the local supply voltage for the previous stage logic circuit and the third register output from the third register 63, which is the same as the output of the demultiplexer 65 for a test employing the critical voltage droop test vector and a previous setting of the local supply voltage for the previous stage logic circuit. The first comparator 67 and the second comparator 68 generate a "1" output if and only if the two inputs to the respective comparator (67 or 68) are the same.

The AND gate 69 performs a logical "AND" operation of the output of the first comparator 67 and the second comparator 68. The output signal of the AND gate 69, which is labeled "V_select," is generated based on whether the logic values of the first comparator 67 and the second comparator 68 are the same or not. The value of the output signal of the AND gate 69 is "1" only if the fist comparator 67 and the second comparator 68 provide output values of "1," i.e., only if the output of the previous stage logic circuit does not change in successive two tests employing the critical delay path test vector and the output of the previous stage logic circuit does not change in successive two tests employing the critical voltage droop test vector.

According to the present invention, an instance of the third exemplary test circuit 600 replaces a register at each input node of a second stage logic circuit, such as the second logic circuit of FIG. 5, which is configured to receive a logic output of a first stage logic circuit, such as the first logic circuit of FIG. 5. During a test mode of operation, a local supply voltage of the first stage logic circuit may be lowered in every set of two test cycles which start with a first set of test cycles that is known to render the first stage logic circuit operational, e.g., a nominal circuit operation voltage. Within each set of two test cycles, the critical delay path test vector and the critical voltage droop test vector are alternately employed as test vectors. A correct test output is generated and transferred into the second register 62 and the third register until a value of the local supply voltage for the first stage logic circuit is reached at which the logic output of the first stage logic circuit changes, i.e., when the local supply voltage is lowered enough to render the first stage logic circuit non-functional.

During such a testing, the first comparator 67 provides an output of "1" as long as the first stage logic circuit is functional under tests employing the critical delay path test vector, and second comparator 68 provides an output of "1" as long as the first stage logic circuit is functional under tests employing the critical voltage droop test vector. The first comparator output changes when the first stage logic circuit fails for the first time under a test employing the critical delay path test vector, i.e., when the local supply voltage reaches a value at which the first stage logic circuit becomes non-functional for the critical delay path test vector. The second comparator output changes when the first stage logic circuit fails for the first time under a test employing the critical voltage droop test vector, i.e., when the local supply voltage reaches a value at which the first stage logic circuit becomes non-functional for the critical voltage droop test vector. The output of the AND gate 69 changes if any one of the first comparator output and the second comparator output changes from "1" to "0." The change in the output of the AND gate 69 may be employed to indicate the end of testing, and to increase the setting of the local supply voltage for the first stage logic circuit to a known minimum voltage that renders the first stage logic circuit operational. During a normal mode of operation, the third exemplary test circuit 600 selects the output of the first register 61 as the multiplexer output "MUX_Out."

Figure 7:
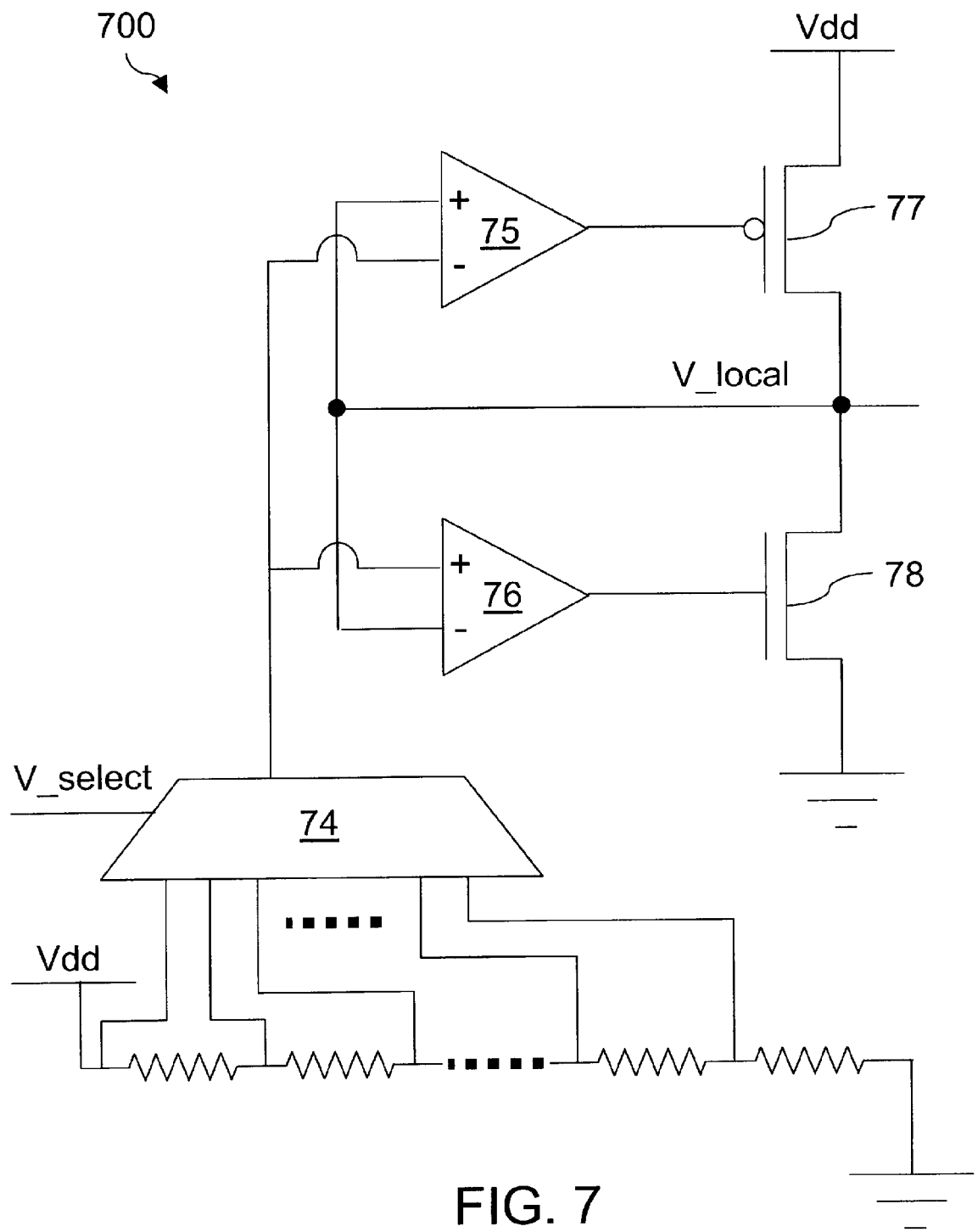
FIG. 7 is an exemplary local supply voltage generator circuit 700 according to the present invention.

Referring to FIG. 7, an exemplary local supply voltage generator circuit 700 according to the present invention comprises a voltage divider, an analog output multiplexer 74, and a voltage stabilization circuit. The exemplary local supply voltage generator circuit 700 may be used to control a group of one or more logic circuits, such as the first logic circuit or the second logic circuit of FIG. 5, to provide a local supply voltage to the rest of the circuitry within the logic circuits. The voltage divider comprises a set of resistors in serial connection between a global supply voltage (labeled "Vdd") and electrical ground. The output of the analog output multiplexer 74 is selected from multiple reference voltage inputs to the analog output multiplexer 74, which is provided from the various tapping points of the voltage divider. The output of the analog output multiplexer 74, which is an analog voltage that is substantially the same as one of the multiple reference voltage inputs based on the output of a test circuit, which may be selected, for example, from the first through third exemplary test circuits and the exemplary semiconductor circuit 500 described above. Specifically, the voltage select signal (labeled "V_select") may be the comparator output from the comparator 47 of the second exemplary test circuit 400, the output of the OR gate 59 of the exemplary semiconductor circuit 500, or the output of the AND gate 69 in the third exemplary test circuit 600.

The voltage stabilization circuit comprises a first operational amplifier 75 and a second operational amplifier coupled with a series connection of a p-type field effect transistor 77 and an n-type field effect transistor 78 between the global power supply voltage Vdd and the electrical ground. The voltage stabilization circuit generates a local supply voltage (labeled "V_local") that is supplied to a logic circuit, e.g., the first logic circuit or the second logic circuit in FIG. 5.

A logic circuit (not shown in FIG. 7; See the first logic circuit and the second logic circuit in FIG. 5) may be supplied by a local supply voltage generator circuit. In one embodiment, the logic circuit may be configured to reduce the local supply voltage in the next round of testing during operation in a test mode if and only if the voltage select signal (labeled "V_select") indicates that the test results have not changed from the previous round of testing, i.e., remain at the value of "1." Once the minimum local supply voltages are determined for each of the logic circuit by the change in the voltage select signal, the setting for the local supply voltage, which renders the logic circuit non-functional at this point, may be adjusted to restore the last good local supply voltage that renders the logic circuit functional again. This may be effected by configuring the analog output multiplexer 74 to increment the local supply voltage by one setting if and only if the voltage select signal changes from "1" to "0," which corresponds to the first voltage at which the logic circuit fails as the local supply voltage to the logic circuit is continually decreased in each successive testing cycle. Thus, the minimum local supply voltage at which the logic circuit is still operational may be set by testing.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor circuit comprising:
a logic circuit providing a logic output;
a first register receiving said logic output and generating a first register output;
a second register receiving said first register output and generating a second register output;
a comparator that compares said first register output and said second register output and generating a comparator output; and
a multiplexer receiving said first register output, at least one test vector bit, and a test signal and generating a multiplexer output; wherein a supply voltage of said logic circuit is controlled by said comparator output as a circuit operation parameter which modulates a local supply voltage within said logic circuit.

2. The semiconductor circuit of claim 1, wherein said multiplexer output is selected based on said test signal between said first register output and said at least one test vector bit.

3. The semiconductor circuit of claim 1, wherein said at least one test vector bit includes at least one of a critical delay path test vector bit and a critical voltage droop test vector bit, wherein said critical delay path test vector bit is a data bit that induces maximum signal delay time within said logic circuit, and wherein said critical voltage droop test vector bit is a data bit that induces maximum droop in a local supply voltage in said logic circuit.

4. The semiconductor circuit of claim 1, wherein said at least one test vector bit is hard coded into said multiplexer by wiring to a global supply voltage or to ground.

5. The semiconductor circuit of claim 1, wherein said at least one test vector bit is generated by an external test circuit in a semiconductor chip or supplied by a tester external to a semiconductor chip.

6. The semiconductor circuit of claim 1, wherein said logic output is transferred through said first register to become said first register output in a test cycle.

7. The semiconductor circuit of claim 1, wherein said logic circuit is configured to reduce said local supply voltage if and only if said first register output and said second register output are the same.

8. The semiconductor circuit of claim 1, further comprising a test stop monitor circuit receiving said comparator output and generating a test stop signal if and only if said first register output and said second register output are different, wherein routing of said test stop signal is configured to induce stopping of testing on said logic circuit.

9. The semiconductor circuit of claim 1, wherein said logic circuit is configured to increment said local supply voltage if and only if said first register output and said second register output are different.

10. The semiconductor circuit of claim 1, wherein said logic circuit includes a local supply voltage generator, wherein said local supply voltage generator generates said local supply voltage from a global supply voltage having a magnitude greater than or equal to said local supply voltage.

11. The semiconductor circuit of claim 10, wherein said local supply voltage generator comprises a voltage divider and a second multiplexer, wherein an output of said second multiplexer is selected from multiple reference voltage inputs to said second multiplexer based on said comparator output.

12. A semiconductor circuit comprising:
a first register generating a first register output;
a second register receiving said first register output and generating a second register output;
a first comparator that compares said first register output and said second register output and generating a first comparator output signal;
a first multiplexer receiving said first register output, at least one first test vector bit, and a test signal and generating a first multiplexer output;

a logic circuit receiving said first multiplexer output as a logic input and generating a logic output;

a third register receiving said logic output and generating a third register output;

a fourth register receiving said third register output and generating a fourth register output;

a second comparator that compares said third register output and said fourth register output and generating a second comparator output; and a second multiplexer receiving said third register output, at least another test vector bit, and said test signal and generating a second multiplexer output, wherein said each of said at least one test vector bit is derived from a same test vector as one of said at least another test vector bit.

13. The semiconductor circuit of claim 12, wherein said same test vector is one of a critical delay path test vector and a critical voltage droop test vector, wherein said critical delay path test vector is a data set that induces maximum signal delay time within said logic circuit, and wherein said critical voltage droop test vector is a data set that induces maximum droop in a local supply voltage in said logic circuit.

14. A method of determining a minimum operational voltage for a local voltage island in a semiconductor chip, said method comprising:

providing a circuit comprising:

a multiplexer receiving at least one test vector bit and generating a multiplexer output and having a test input node to which a test input signal is applied;

a logic circuit receiving said multiplexer output as a logic input and generating a logic output;

a first register receiving said logic output and generating a first register output;

a second register receiving said first register output and generating a second register output;

a comparator that compares said first register output and said second register output and generating a comparator output: and a local supply voltage generator circuit employing said comparator output to modulate a local supply voltage of said logic circuit;

applying a test input signal to said test input node, wherein said multiplexer output is selected from said at least one test vector bit based on said test input signal; and adjusting said local supply voltage based on said local supply voltage generation circuit based on said comparator output.

15. The method of claim 14, further comprising reducing said local supply voltage if and only if said first register output and said second register output are the same.

16. The method of claim 14, further comprising generating a test stop signal if and only if said first register output and said second register output are different.

17. The method of claim 14, further comprising increasing said local supply voltage if and only if said first register output and said second register output are different.

18. The method of claim 14, wherein said logic output is transferred through said first register to become said first register output in a test cycle.

19. The method of claim 14, wherein said logic circuit includes a local supply voltage generator, wherein said local supply voltage generator generates said local supply voltage from a global supply voltage having a magnitude greater than or equal to said local supply voltage.

20. The method of claim 19, wherein said local supply voltage generator comprises a voltage divider and a second multiplexer, wherein an output of said second multiplexer is selected from multiple reference voltage inputs to said second multiplexer based on said comparator output, wherein said local supply voltage is decremented by one setting if said first register output and said second register output are the same, and wherein said local supply voltage is incremented by one setting if said first register output and said second register output are the same.

* * * * *